United States Patent
Chen et al.

(10) Patent No.: US 6,448,159 B1
(45) Date of Patent: Sep. 10, 2002

(54) CHEMICAL MECHANICAL POLISHING FOR FORMING A SHALLOW TRENCH ISOLATION STRUCTURE

(75) Inventors: Coming Chen, Taoyuan Hsien; Juan-Yuan Wu, Hsinchu; Water Lur, Taipei, all of (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 09/692,251

(22) Filed: Oct. 19, 2000

Related U.S. Application Data

(62) Division of application No. 09/111,007, filed on Jul. 7, 1998, now Pat. No. 6,169,012.

(30) Foreign Application Priority Data

Jun. 3, 1998 (TW) .......................................... 87108699

(51) Int. Cl.[7] .............................................. H01L 21/20
(52) U.S. Cl. ...................................... 438/500; 438/942
(58) Field of Search ............... 427/372.2; 438/500–502, 438/942

(56) References Cited

U.S. PATENT DOCUMENTS

| | | | | |
|---|---|---|---|---|
| 4,755,050 A | * | 7/1988 | Watkins ................... | 356/243.5 |
| 5,459,096 A | | 10/1995 | Venkatesan et al. | |
| 5,498,565 A | | 3/1996 | Gocho et al. | |
| 5,626,913 A | * | 5/1997 | Tomoeda et al. ........... | 427/299 |
| 5,792,707 A | | 8/1998 | Chung | |
| 5,837,612 A | | 11/1998 | Ajuria et al. | |
| 5,854,133 A | | 12/1998 | Hachiya et al. | |
| 5,858,842 A | | 1/1999 | Park | |
| 5,885,856 A | * | 3/1999 | Gilbert et al. ............... | 438/129 |
| 5,902,752 A | | 5/1999 | Sun et al. | |
| 5,911,110 A | | 6/1999 | Yu | |
| 5,923,993 A | | 7/1999 | Sahota | |
| 5,926,723 A | * | 7/1999 | Wang .......................... | 438/435 |
| 5,958,795 A | | 9/1999 | Chen et al. | |
| 6,013,558 A | | 1/2000 | Harvey et al. | |
| 6,020,616 A | * | 2/2000 | Bothra et al. ................ | 257/381 |
| 6,117,622 A | * | 9/2000 | Eisele et al. ................. | 430/328 |
| 6,169,012 B1 | | 1/2001 | Chen et al. | |

FOREIGN PATENT DOCUMENTS

JP 62142334 A * 6/1987

* cited by examiner

Primary Examiner—Carl Whitehead, Jr.
Assistant Examiner—Jamie L. Brophy
(74) Attorney, Agent, or Firm—Eugene J. Bernard; William J. Kubida; Hogan & Hartson LLP

(57) ABSTRACT

A method of chemical-mechanical polishing for forming a shallow trench isolation is disclosed. A substrate having a number of active regions, including a number of relative large active regions and a number of relative small active regions, is provided. The method comprises the following steps. A silicon nitride layer on the substrate is first formed. A number of shallow trenches are formed between the active regions. An oxide layer is formed over the substrate, so that the shallow trenches are filled with the oxide layer. A partial reverse active mask is formed on the oxide layer. The partial rever active mask has an opening at a central part of each relative large active region. The opening exposes a portion of the oxide layer. The opening has at least a dummy pattern. The oxide layer on the central part of each large active region is removed to expose the silicon nitride layer. The partial reverse active mask is removed. The oxide layer is planarized to expose the silicon nitride layer.

4 Claims, 4 Drawing Sheets

CHEMICAL MECHANICAL POLISHING FOR FORMING A SHALLOW TRENCH ISOLATION STRUCTURE

CROSS-REFERENCE TO RELATED APPLICATION

The present application is a divisional of U.S. patent application Ser. No. 09/111,007, filed Jul. 7, 1998, now U.S. Pat. No. 6,169,012, which claims priority from Taiwan Application No. 87108699, filed Jun. 3, 1998, all the disclosures of which are herein specifically incorporated by this reference.

BACKGROUND OF THE INVENTION

1. Field of the Invention

This invention relates to a chemical mechanical polishing (CMP) applied in forming shallow trench isolation (STI), and more particularly, to a process of forming a STI structure combining CMP, using a partial reverse active mask.

2. Description of Related Art

CMP is now a technique ideal for appling in global planarization in very large scale integration (VLSI) and even in ultra large scale integration (ULSI). Moreover, CMP is likely to be the only reliable technique as the feature size of the integrated circuit (IC) is highly reduced. Therefore, it is of great interest to develope and improve the CMP technique in order to cut down the cost.

As the IC devices are contineously sized down to a linewith of 0.25 $\mu$m or even 0.18 $\mu$m (deep sub-half micron), using CMP to planarize the wafer surface, especially to planarize the oxide layer on the surface of the shallow trench, becomes even more important. To prevent the dishing effect occuring at the surface of a larger trench during CMP process and to obtain a superior CMP uniformity, a reverse tone active mask was proposed, cooperated with an etching back process.

Typically, the active regions have varied sizes and the shallow trenches between the active regions also have different sizes. FIG. 1A to FIG. 1E are cross sectional veiws showing the process steps for forming shallow trench isolation, using CMP. Referring to FIG. 1A, on a substrate 10, a pad oxide 15 and a silicon nitride layer 16 are deposited successively. By photolithography, the substrate 10, the pad oxide layer 15 and the silicon nitride layer 16 are anisotropically etched to form shallow trenches 14a, 14b, 14c and define active regions 12a, 12b, 12c, 12d. The sizes of the shallow trenches 14a, 14b, 14c are different since the sizes of the active regions 12a, 12b, 12c, 12d are varied.

Next, referring to FIG. 1B, an oxide layer 18 is deposited by atmosphere pressure chemical vapor deposition (APCVD) on a substrate 10 to fill the interior of the shallow trenches 14a, 14b, 14c. However, due to the step coverage of the oxide layer 18, the deposited oxide layer 18 has an uneven surface and a rounded shaped. Then, a photoresist layer is coated on the surface of the oxide layer 18 and patterned to form a reverse active mask 20 by photolithography. The reverse active mask 20 covers the shallow trenches 14a, 14b, 14c and is complementary to the active regions 12a, 12b, 12c, 12d. However, during the formation of the reverse active mask, misalignment causes the oxide layer 18 to cover more than the shallow trenches 14a, 14b, 14c.

Referring to FIG. 1C, the oxide layer 18 exposed outside the reverse active mask is etched until the silicon nitride layer 16 is exposed so that only a part of the silicon oxide layer 18, the silicon oxide layer 18a, is formed. After removing the reverse active mask 20, as shown in FIG. 1D, it is obserable that the silicon oxide layer 18a remained does not fully cover the shallow trenches 14a, 14b, 14c at one sides of the shallow trenches 14a, 14b, 14c, therefore, forming cavities 22, but at the other sides over-cover the shallow trenches 14a, 14b, 14c, forming photo-overlap 24.

Referring to FIG. 1E, the portion of the oxide layer 18a higher than the shallow trenches 14a, 14b, 14c is polished by CMP until the surface of the silicon nitride layer 16 is exposed. Therefore, the silicon nitride layer 16 and the silicon oxide layer 18a are at the same level. The profile of the silicon oxide layer 18a formed by APCVD is rather rounded and the APCVD silicon oxide layer 18a is hard to be planarized. Moreover, it is obvious that the silicon oxide layer 18a does not fully fill the shallow trenches 14a, 14b, 14c but form the concaves 22. The undesired concaves 22 may cause kink effect and consequent short circuit or leakage current which therefore influence the yield.

As a result, it is important to overcome the problems coming after the formation of the concaves due to the misalignment of the reverse active mask during the process of CMP, especially, while nowadays the linewidth is decreasing.

SUMMARY OF THE INVENTION

It is therefore an objective of the present invention to provide a method of chemical-mechanical polishing for forming a shallow trench isolation. A substrate having a number of active regions, including a number of relative large active regions and a number of relative small active regions, is provided. The method comprises the following steps. A silicon nitride layer on the substrate is first formed. A number of shallow trenches are formed between the active regions. An oxide layer is formed over the substrate, so that the shallow trenches are filled with the oxide layer. A partial reverse active mask is formed on the oxide layer. The partial reverse active mask has an opening at a central part of each relative large active region. The opening exposes a portion of the oxide layer. The opening has at least a dummy pattern. The oxide layer on the central part of each large active region is removed to expose the silicon nitride layer. The partial reverse active mask is removed. The oxide layer is planarized to expose the silicon nitride layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a process for forming STI, combining the partial reverse active mask and CMP, using high density plasma chemical vapor deposition (HDCVD). This process prevents the formation of concaves in the shallow trenches due to the misalignment of the reverse active mask, which consequently causes short circuit or leakage current.

Figure 1A:
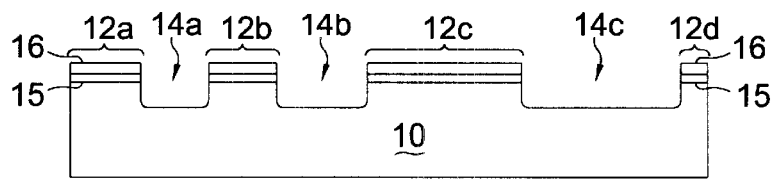
FIG. 1A to FIG. 1E are cross-sectional views showing the process steps of forming a conventional shallow trench using a reverse active mask.
Figure 1B:
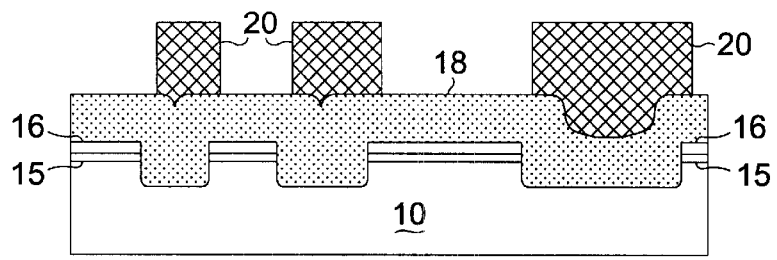
Figure 1C:
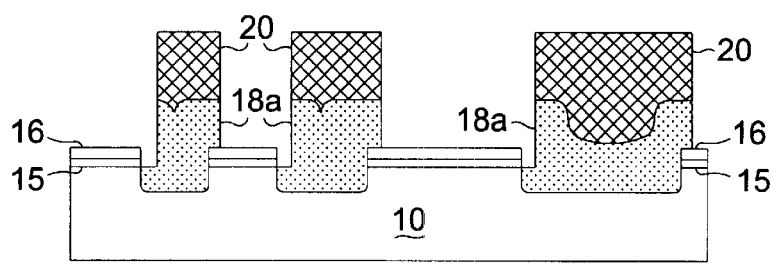
Figure 1D:
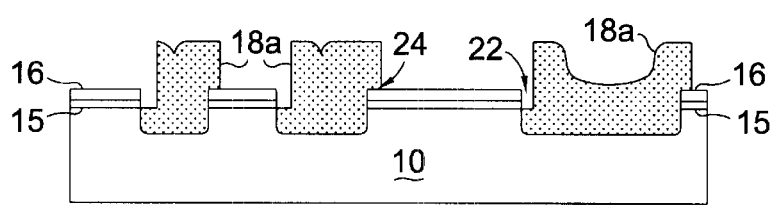
Figure 1E:
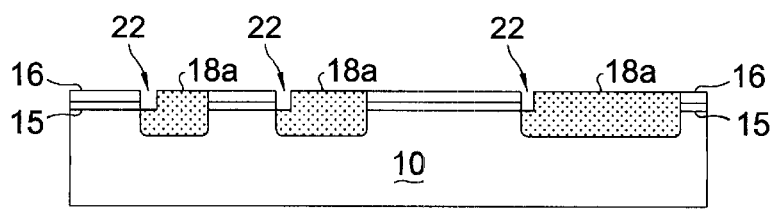
Figure 2A:
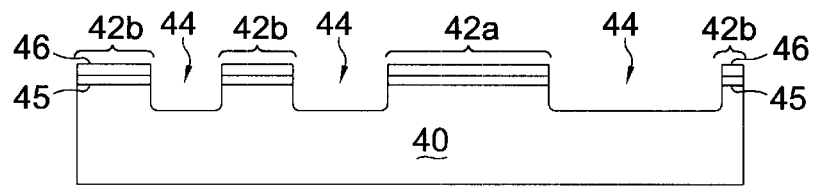
FIG. 2A to FIG. 2E are cross-sectional views showing the process steps of forming shallow trenches using a partial reverse active mask according to a preferred embodiment of the invention.
Figure 2B:
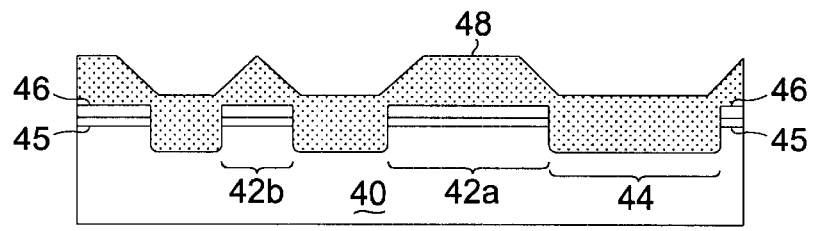

Referring to FIG. 2A, active regions 42a, 42b are defined on a substrate 40 first by depositing a pad oxide layer 45 and a silicon nitride layer 46, and then by photolithography and trench etching to form shallow trenched 44 between the active regions 42a, 42b. The sizes of the shallow trenshes are varied since the sizes of the active regions 42a, 42b are different. Then, a silicon oxide layer 48 is deposited over the substrate 40 and filling the trenches 44, preferred by high density plasma chemical vapor deposition (HDPCVD). The profile of the silicon oxide layer 48 on the active region 42a, 42b is at a higher level than that of the silicon oxide layer 48 on the shallow trenches 44 since the shallow trenches is fallen in the substrate 40. The HDPCVD oxide layer 48 on the active region 42a,42b has a sharp profile, as shown in FIG. 2B, which is different from the conventional.

Figure 2C:
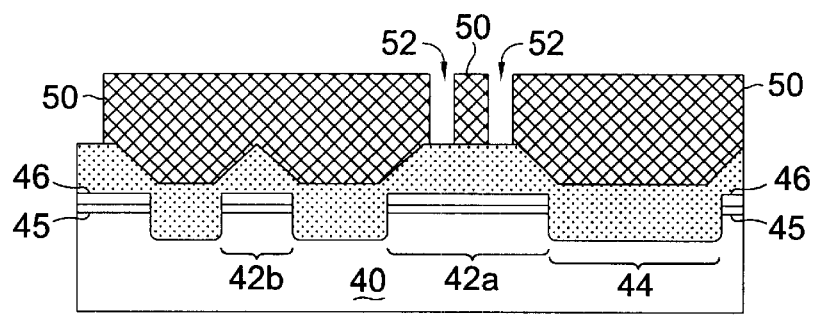

Referring to FIG. 2C, a photoresist layer is coated on the oxide layer 48 and difened to form a partial reverse active mask 50 by photolithography. The partial reverse active mask 50 has an opening 52 at the central part of the larger active region 42a. Since the opening 52 exposes only the central part of the silicon oxide layer 48 at the larger active region 42a, the silicon oxide layer 48 over the shallow trenches 44 will not be exposed eve n though misalignment occurs.

Figure 2D:
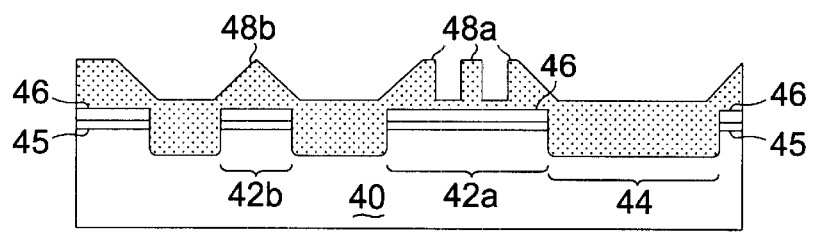

Referring to FIG. 2D, using the reverse active mask 50 as a mask, the exposed silicon oxide layer 48 at the larger active region 42a is etched back until the silicon nitride layer 46 is exposed. The reverse active mask is then peeled. Then, only the oxide layer 48b on the smaller active region 42b and a small portion of the silicon oxide layer 48a through etching back on the larger active region 42a are remained. The remained silicon oxide layer 48a and 48b formed preferrably by HDCVD have sharp profile and is therefore easy to be planarized by CMP. Also, the sizes of the remained silicon oxide layer 48a and 48b are more or less similar so that the consistence of CMP is increased.

Figure 2E:
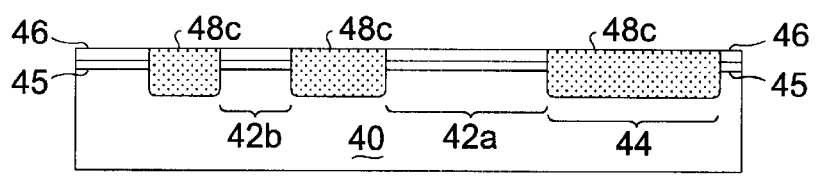

Next, referring to FIG. 2E, the remained silicon oxide layer 48a and 48b (as shown in FIG. 2D) are polished by CMP, using the silicon nitride layer 46 as an etching stop layer so that the silicon oxide layer 48c in the shallow trenches and the silicon nitride layer 46 are almost at the same level.

Figure 3A:
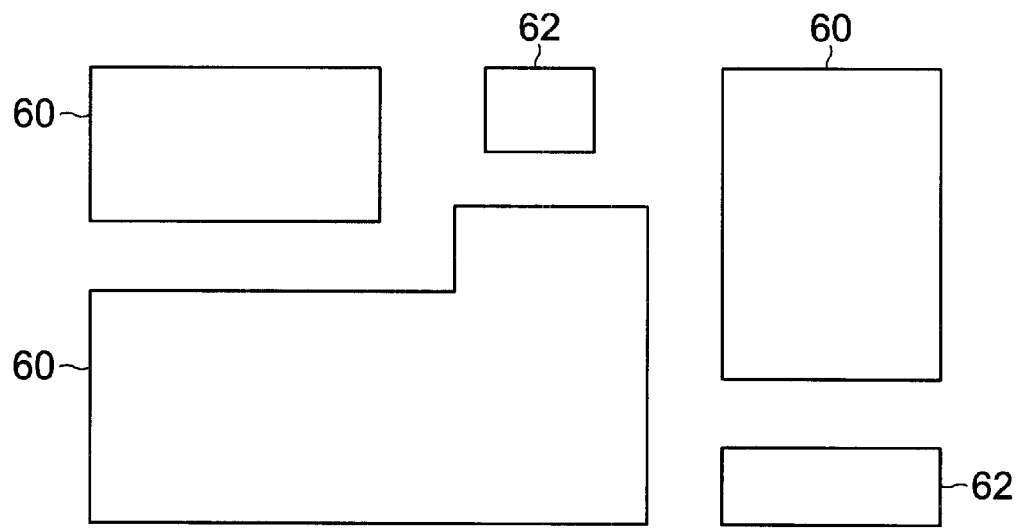
FIG. 3A to FIG. 3D illustrate the partial reverse active mask according to a preferred embodiment of the invention.

In the above embodiment, a partial reverse active mask is employed for forming a shallow trench isolation structure. In FIG. 3A to FIG. 3D, a method of forming a partial reverse active mask pattern is shown. As shown in FIG. 3A, to define a photo-mask pattern, active regions are generated in a computer-aided-design (CAD) tool first. The active regions include a larger active region pattern 60 and a smaller active region pattern 62.

Figure 3B:
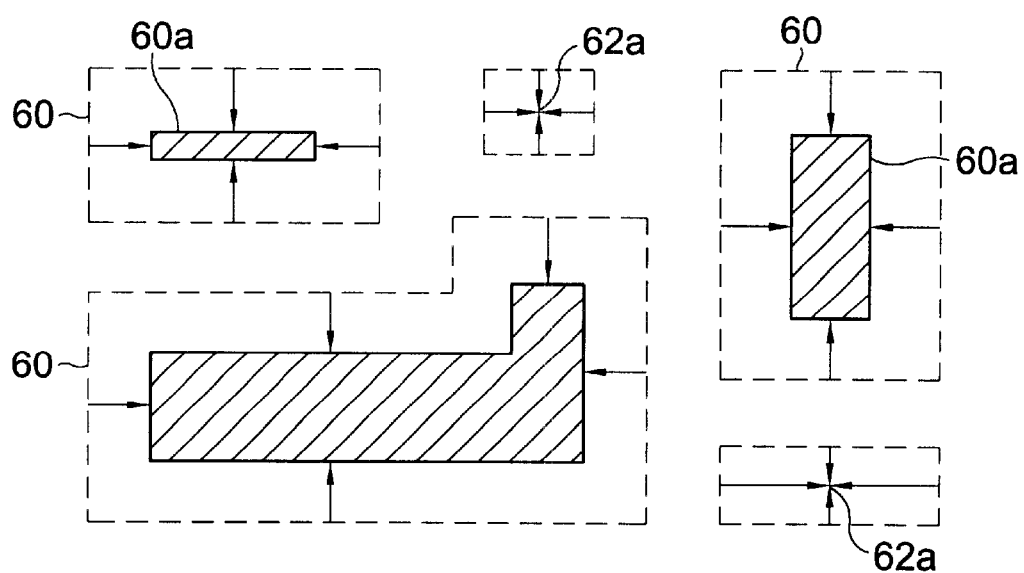

Referring to FIG. 3B, the larger active region pattern 60 and the smaller active pattern region 62 are shrunk as shown in the figure. The shrinking larger active region pattern and the shrinking smaller active region pattern are denoted as 60a and 62a respectively.

Figure 3C:
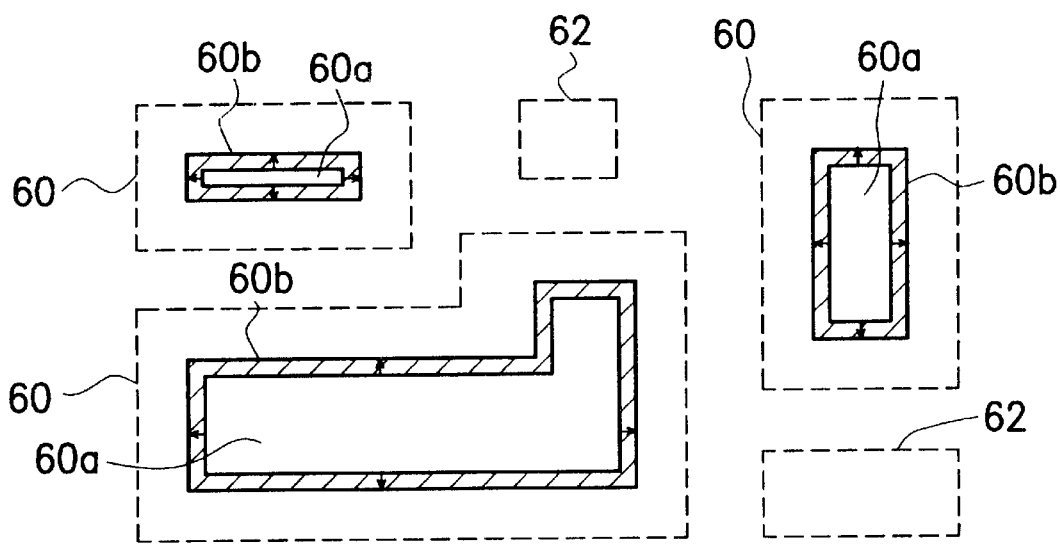

Refering to FIG. 3C, the shrinking process is continued until the shrinking smaller active region pattern 62a disappears. The shrinking distance is about 0.5 $\mu$m to 2 $\mu$m each side so that active region patterns with maximum radius of less that 1~4 $\mu$m will disappear. Next, the shrinking larger active region 60a is enlarged until the profile of it is a little bit smaller than the profile of the original larger active region pattern. The profile of the larger active region pattern at the stage is denoted as 60b. The shrinking large active region pattern 60a is enlarged with a dimension of about 0.2 $\mu$m to 2 $\mu$m each side. This enlarged dimension is smaller than the shrinking distance mentioned above.

Figure 3D:
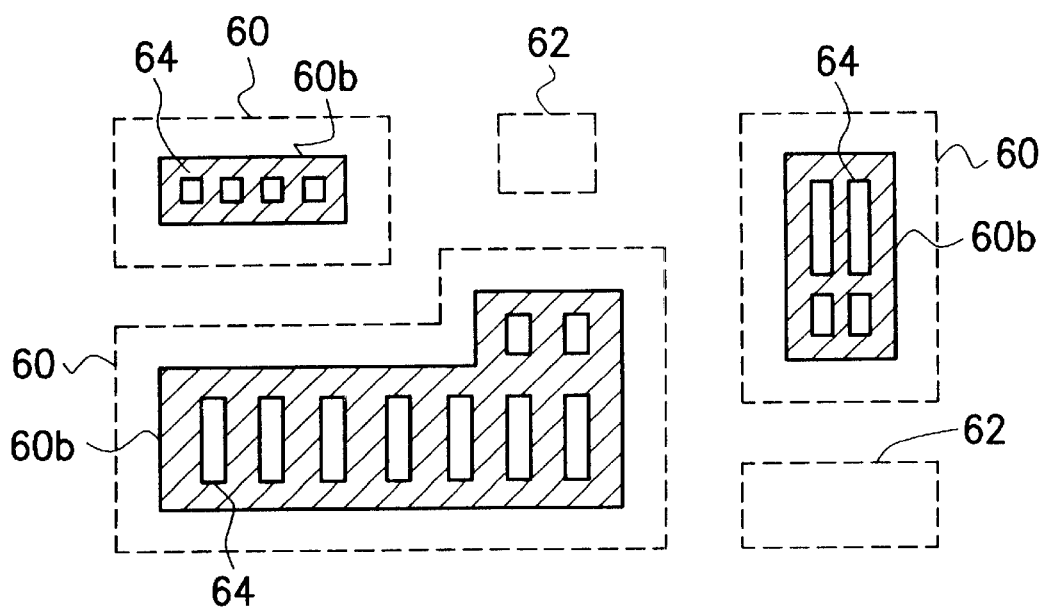

Referring to FIG. 3D, the partial reverse active mask 60b is located at the central part of the larger active region 60 but slightly smaller than the larger active region. One characteristic of the present invention is that the partial reverse active mask pattern 60b at the larger active region 60 has dummy pattern 64 so that dishing effect at the larger active region 60 can be avoided. By applying this photo-mask pattern in forming a shallow trench isolation, the central part of an active region is exposed, whereas the edge part of the active region is covered by a photo-resist. A partial reverse active mask pattern is thus obtained.

The advantages of the invention are:

(1) The oxide layer formed by HDCVD has a pyramid-like profile, so that using chemical-mechanical polishing, the oxide layer is planarized easily.

(2) Using a partial reverse active mask to etch away the oxide layer on the central part of an active region, only the oxide layer on the edge part of the active region and on a small active region is remained. The profile of the remaining oxide layer is pyramid-like and has a better uniformity. Therefore, a recess formed while polishing a large trench is avoided.

(3) The dishing effect on the large active region is avoided since the partial reverse active mask has a dummy pattern.

(4) Since only the oxide layer on the central part of an active region is etched away by using a partial reverse active mask, even when a misalignment occurs, the oxide layer within the trench is not etched. The kink effect is prevented. As a consequence, the current leakage and the short circuit caused by kink effect are avoided, so that the yield of wafer is enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for forming a photo-mask pattern, the method comprising the steps of:

generating a mask pattern, wherein the mask pattern comprises a plurality of relative large active region patterns and a plurality of relative small active region patterns;

shrinking the relative large active region patterns and the relative small active region patterns until the relative small active region patterns disappear and the relative large active region patterns become a remaining relative large active region patterns;

enlarging the remaining relative large active region patterns so that the remaining relative large active region patterns are substantially smaller than original profiles of the relative large active regions and each of the relative large active region patterns has at least one dummy pattern.

2. A method as claimed in claim 1, wherein said step of shrinking the relative large active region patterns and the relative small active region patterns, a shrinking size is about between 0.5 $\mu$m and 2 $\mu$m.

3. A method as claimed in claim 1, wherein in said step of enlarging the remaining relative large active region patterns, an enlarging size is about between 0.2 $\mu$m and 2 $\mu$m.

4. A method as claimed in claim 1, wherein an enlarging size in said step of enlarging the remaining relative large active region patterns is substantially smaller than a shrinking size in said step of shrinking the relative large active region patterns and the relative small active patterns.

* * * * *